(12) United States Patent
Lin (10) Patent No.: US 6,349,402 B1
(45) Date of Patent: Feb. 19, 2002

(54) METHOD AND APPARATUS FOR OPTIMIZING DIFFERENTIAL PAIRS BASED ON TIMING CONSTRAINTS

(76) Inventor: Kuoching Lin, 12453 SW. Sheldrake Way, Beaverton, OR (US) 97007

( * ) Notice: Subject to any disclaimer, the term of this patent is extended or adjusted under 35 U.S.C. 154(b) by 0 days.

(21) Appl. No.: 09/112,630

(22) Filed: Jul. 9, 1998

(51) Int. Cl.[7] .............................................. G06F 17/50
(52) U.S. Cl. .............................................. 716/2; 716/6
(58) Field of Search ............................ 716/1, 2, 4, 6, 716/10, 12, 13

(56) References Cited

U.S. PATENT DOCUMENTS

| | | | | |
|---|---|---|---|---|
| 5,402,358 A | * | 3/1995 | Smith et al. | 364/490 |
| 5,416,722 A | * | 5/1995 | Edwards | 364/491 |
| 5,461,576 A | * | 10/1995 | Tsay et al. | 364/490 |
| 6,223,328 B1 | * | 4/2001 | Ito et al. | 716/6 |

* cited by examiner

*Primary Examiner*—Matthew Smith
*Assistant Examiner*—Leigh Marie Garbowski
(74) *Attorney, Agent, or Firm*—Columbia IP Law Group, PC

(57) ABSTRACT

A method to optimize differential pairs, based on timing constraints, includes recognizing that two separate traces form a differential pair, and combining sections of the differential pair into one or more trunks. Then, a propagation delay is determined over the differential pair. The determined propagation delay is compared to a timing constraint for the differential pair. If the timing constraint is not met, a length of one or more of the trunks is adjusted and the propagation delay is redetermined and compared to the timing constraint. If the timing constraint is still not met, the process is repeated until the timing constraint is met or until the timing constraint cannot be met. If the timing constraint is eventually met, the one or more trunks are used to produce an adjusted differential pair.

30 Claims, 5 Drawing Sheets

METHOD AND APPARATUS FOR OPTIMIZING DIFFERENTIAL PAIRS BASED ON TIMING CONSTRAINTS

BACKGROUND OF THE INVENTION

1. Field of the Invention

The present invention pertains to the field of electronic design automation (EDA). More particularly, this invention relates to the art of optimizing differential pairs.

2. Background

Advances in technology have lead to increasingly complex circuits. At the board level, circuits are routinely composed of dozens of complex very large scale integration (VLSI) components. Hundreds, or even thousands, of conductive traces may be routed in one or more layers of a printed circuit board (PCB) to selectively connect the components. At the chip level, integrated circuit design is moving toward even more complex circuits, wherein an entire system can often be routed on a single chip. At both levels, every trace must meet a number of constraints, such as signal integrity and minimum and maximum signal delays. It would be incredibly time consuming, if not physically impossible, for a person to manually route all of the physical traces, and verify all of the signal constraints, in today's complex electronic designs.

Even as complexity increases, however, market pressures require shorter design cycles. The pace of competition will not allow a designer to spend countless hours routing a design on a chip or PCB manually. As a result, designers are always looking for ways to streamline the design process.

One simplification involves designing at a higher level of abstraction. In other words, a designer can provide a description of a circuit design, such as a "netlist," to an electronic design automation (EDA) system. A netlist generally specifies all of the component connections in a circuit design. A netlist may also include physical dimensions of components in the design, the dimensions of the PCB or chip to which the components are coupled, pin locations for the components and PCB or chip, the location of components on the PCB or chip, as well as certain employment rules such as timing constraints and minimum spacing requirements.

From a netlist, an EDA system can attempt to route all of the traces automatically. Depending on the complexity of the design, and the employment rules, an EDA system may or may not be able to route all of the traces. If the EDA system cannot make all of the necessary connections, or the timing constraints cannot be met, a designer will normally have to make adjustments to the design and run it through the EDA system again. Many iterations may be necessary to produce a functional circuit layout. Each iteration consumes valuable computer time and adds cost to the design.

Therefore, EDA systems need to be improved. In particular, a need exists for an improved method and apparatus to optimize differential pairs based on timing constraints.

SUMMARY OF THE INVENTION

A method to optimize differential pairs, based on timing constraints, includes recognizing that two separate traces form a differential pair, and combining sections of the differential pair into one or more trunks. Then, a propagation delay is determined over the differential pair. The determined propagation delay is compared to a timing constraint for the differential pair. If the timing constraint is not met, a length of one or more of the trunks is adjusted and the propagation delay is redetermined and compared to the timing constraint. If the timing constraint is still not met, the process is repeated until the timing constraint is met or until the timing constraint cannot be met. If the timing constraint is eventually met, the one or more trunks are used to produce an adjusted differential pair.

BRIEF DESCRIPTION OF THE DRAWINGS

Examples of the present invention are illustrated in the accompanying drawings. The accompanying drawings, however, do not limit the scope of the present invention in any way. Like references in the drawings indicate similar elements.

DETAILED DESCRIPTION

In the following detailed description, numerous specific details are set forth in order to provide a thorough understanding of the present invention. However, those skilled in the art will understand that the present invention may be practiced without these specific details, that the present invention is not limited to the depicted embodiments, and that the present invention may be practiced in a variety of alternate embodiments. In other instances well known methods, procedures, components, and circuits have not been described in detail.

Figure 1:
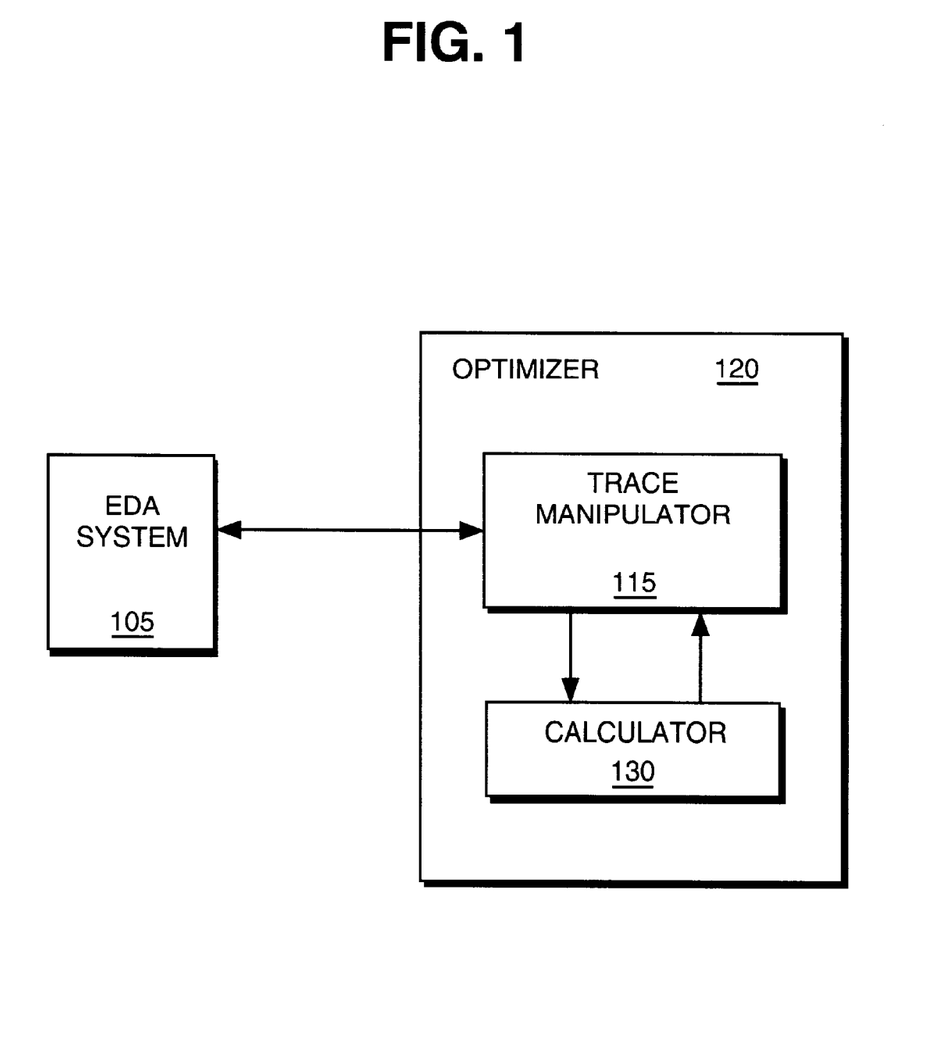
FIG. 1 is a block diagram of one embodiment of the present invention.

FIG. 1 illustrates one embodiment of an electronic design automation (EDA) system 105 which is coupled to an optimizer 120. Optimizer 120 optimizes a circuit design based on timing constraints. In certain embodiments, as discussed in detail below, optimizer 120 operates on differential pairs. Optimizer 120 determines a propagation delay over a differential pair, and adjusts the length of the differential pair until the propagation delay meets a timing constraint. If a timing constraint cannot be met, for example where the propagation delay over the shortest possible route is still too long, then the faulty differential pair is flagged so that it can be corrected. Certain embodiments of optimizer 120 also take into consideration high speed signal integrity factors.

Figure 2:
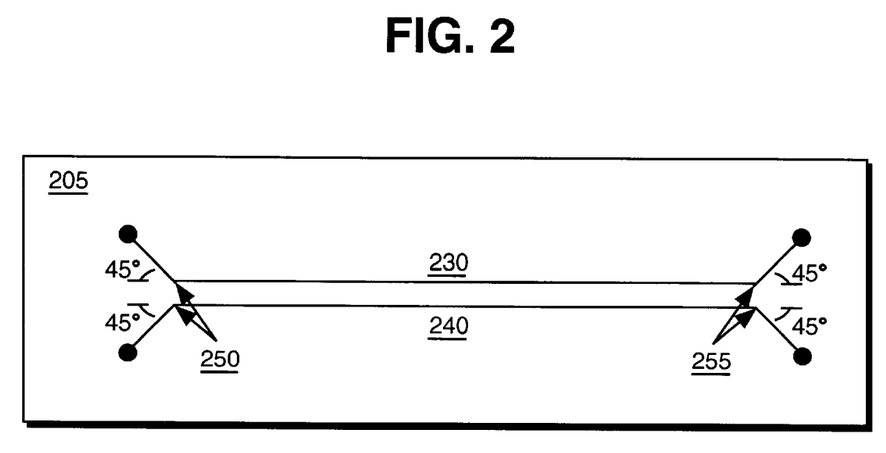
FIG. 2 illustrates a differential pair of traces.

FIG. 2 illustrates a simple example of a differential pair of conductive traces 230 and 240 routed on a printed circuit board (PCB) 205. When a signal is propagated on the differential pair, each trace propagates a mirror image wave form, and the signal is equal to the difference between the two wave forms. Since the traces are substantially parallel and in close proximity to one another, both traces generally experience the same interference. As a result, the difference in the wave forms, and hence the signal, remains unaffected by interference experienced by both traces.

In general, interference is magnified as frequency increases. Since differential pairs are less susceptible to interference than single entity transmission lines, differential pairs are particularly suited for high frequency signal propagation. Thus, differential pairs must frequently be optimized in high frequency circuit designs.

As shown in FIG. 2, at points 250 and 255, the traces bend at 45 degree angles. Bends introduce changes in impedance, and changes in impedance cause signal reflections. Sharp bends, particularly 90 degree bends, cause large reflections. A 45 degree bend, however, introduces much less impedance than a 90 degree bend, and causes much smaller reflections. The amount of interference caused by reflections increases as frequency increases. Therefore, 45 degree bends are preferred over 90 degree bends, especially in high frequency circuit designs, in order to maintain signal integrity.

Figure 3:
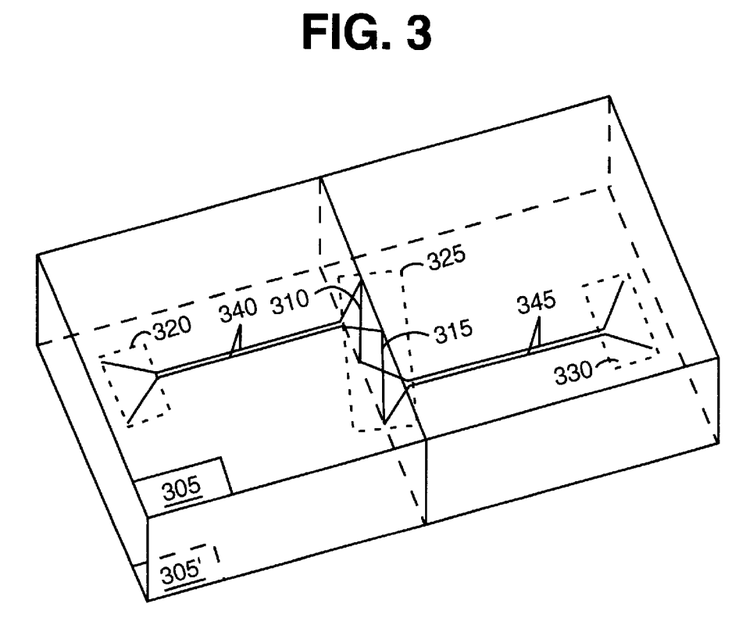
FIG. 3 illustrates a differential pair traversing two layers of a printed circuit board using a via.

FIG. 3 is a simple illustration of a differential pair traversing two layers, 305 and 305', of a PCB. A "via", comprising conductors 310 and 315, is used to jump from one layer to another. Conductors 310 and 315 are electrically coupled to both layers 305 and 305' of the PCB.

Optimizer 120, of FIG. 1, operates on differential pairs like those shown in FIGS. 2 and 3, and verifies that a propagation delay for a signal propagated over a differential pair meets a timing constraint for the differential pair. A timing constraint for a differential pair depends upon the circuit in which the differential pair is used. When a timing constraint is not met, an entire circuit may not perform properly. Therefore, optimizer 120 attempts to adjust the length of the corresponding differential pair to meet the timing constraint. In certain embodiments, optimizer 120 makes adjustments using 45 degree bends where possible in order to maintain high frequency signal integrity. If the differential pair cannot be adjusted to meet the timing constraint, for instance where the shortest possible path is still too long, then optimizer 120 flags the differential pair as faulty.

EDA system 105 represents any of a wide range of routing tools such as those commonly available from Mentor Graphics Corporation of Wilsonville, Oreg. EDA system 105 provides a database to optimizer 120, wherein the database defines a physical circuit layout which has already been routed, but in which differential pairs remain to be optimized. The database also provides timing constraints, timing characteristics, and differential pair employment rules for the circuit layout. After all differential pair timing constraints have been verified or flagged by optimizer 120, the optimized circuit design is returned to EDA system 105.

Figure 4:
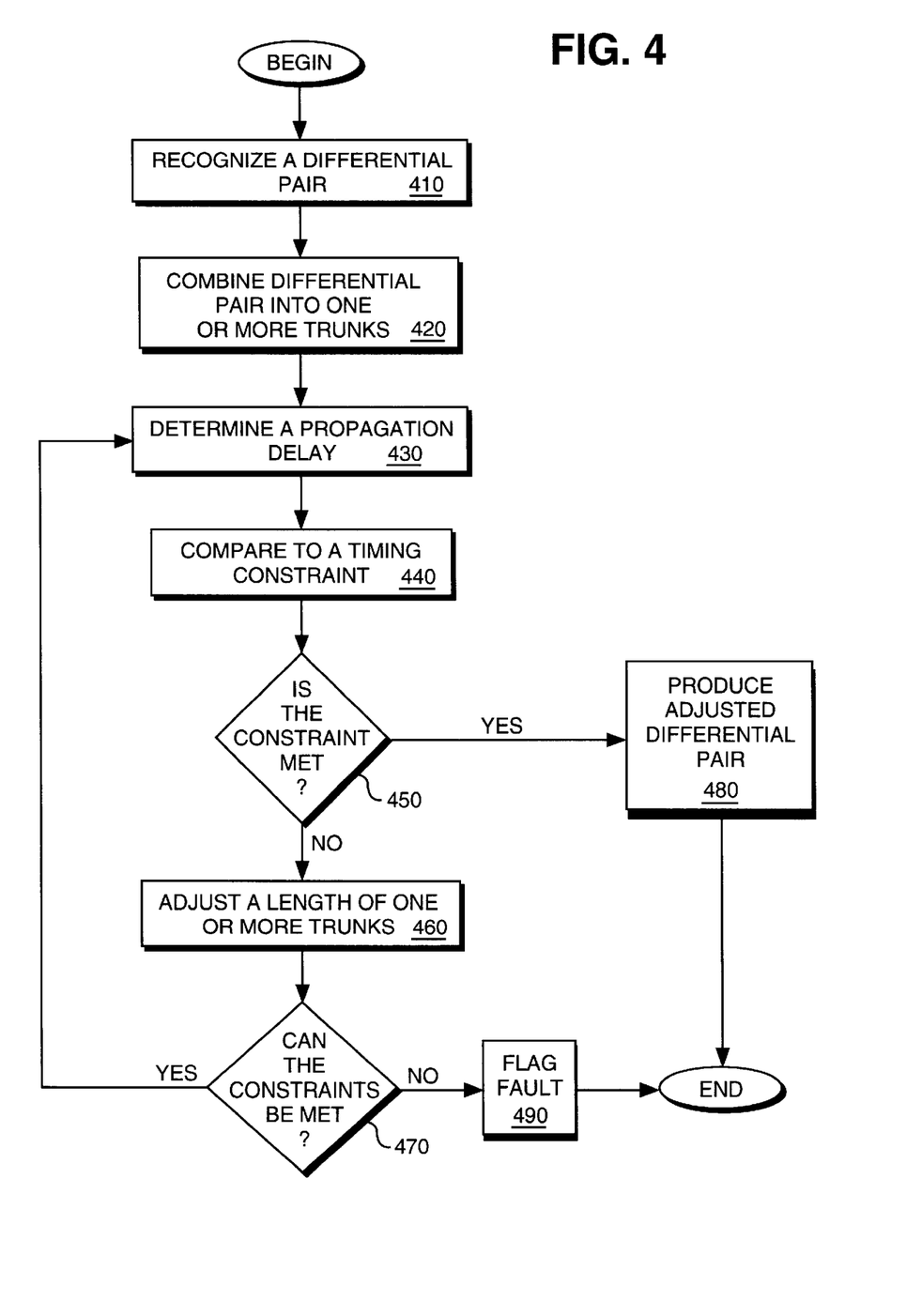
FIG. 4 is a flow chart of one embodiment of the present invention.

FIG. 4 is a flow chart illustrating one embodiment of optimizer 120 operating on a single differential pair in a circuit design. In block 410, trace manipulator 115 recognizes a differential pair of traces. In one embodiment, trace manipulator 115 receives the circuit design database from EDA system 105, and analyzes the database to identify a pair of individual traces comprising a differential pair. Trace manipulator 115 identifies differential pairs based on the differential pair employment rules for the circuit layout. Any two traces that meet the employment rules, to within a particular tolerance, are assumed to comprise a differential pair. For instance, the employment rules may include a separation constraint which requires the traces of a differential pair to be routed in parallel, separated by a particular distance, except for within a particular distance of endpoints and vias.

Then, in block 420, trace manipulator 115 combines the separate traces comprising the differential pair into one or more trunks. In one embodiment, a trunk is a single line representation of a parallel section of the two traces of the differential pair. Trunks are employed for computational expediency. Since the traces of a differential pair are routed, for the most part, in parallel and in close proximity, a single entity trace can be used to represent the parallel sections of the differential pair. Only one propagation delay needs to be determined for each section of trunk, rather than two propagation delays for each section of a differential pair.

Trunks also simplify routing when, for instance, a length of a differential pair needs to be adjusted. That is, a trunk is viewed by optimizer 120 as a single fat line, occupying the physical space required by the two traces of the differential pair, and having the same timing characteristics as the differential pair. When an adjustment is made, only the trunk needs to be re-routed since the trunk occupies sufficient space for the individual traces to be separately routed in the path of the trunk, and a length of trunk will introduce the same estimated amount of delay as the same length of the differential pair.

Since the timing characteristics of the individual traces may not be the same where the traces are not in parallel, trunks only replace parallel sections of a differential pair. In other words, trunks replace sections of a differential pair between endpoint regions and via regions. For instance, the two parallel sections 340 and 345 of the differential pair shown in FIG. 3 would be replaced by two trunks. The endpoint regions, 320 and 330, and the via region 325, would be considered separately.

In block 430 of FIG. 4, calculator 130 determines the propagation delay over the differential pair. Calculator 130 is coupled to trace manipulator 115, and in one embodiment, calculator 130 is called upon by trace manipulator 115 to make the determinations. Propagation delay is not only a function of the conductive material used, the cross-section of the individual traces, and the length of the conductor, but also a function of electromagnetic fields from neighboring conductors and components, impedance changes over the length of the conductor, and the operating frequency.

EDA system 105 instructs optimizer 120 to determine the propagation delay either in a fast mode or a slow mode. In the fast mode, accuracy is sacrificed to some extent for speed. The propagation delay of the differential pair is estimated using any one of a number of available formulas. For instance, one formula aggregates the capacitance introduced from each endpoint region, via region, and trunk and calculates a propagation delay based on the aggregated capacitance.

In the slow mode, speed is sacrificed to some extent for accuracy. The operation of the circuit is simulated and the propagation delay is measured from the simulation. A variety of circuit simulators can be used and are commonly available, such as those available from Mentor Graphics Corporation in Wilsonville, Oreg.

In block 440 of FIG. 4, calculator 130 compares the determined propagation delay to the timing constraint for the differential pair. In one embodiment, the timing constraint defines a maximum and minimum range of propagation delay. If the timing constraint is met in block 450, the differential pair is optimized. Calculator 130 will return a signal to trace manipulator 115 verifying that the particular differential pair is optimized.

Trace manipulator 115 will then produce an adjusted differential pair from the one or more trunks in block 480. In one embodiment, trace manipulator 115 simply replaces the trunks with separate individual traces in the paths left by the trunks. If additional differential pairs remain to be optimized, trace manipulator 115 will begin the process of FIG. 4 again to recognize and optimize the next differential pair. If no more traces remain to be optimized, optimizer 120 will return the optimized database from trace manipulator 115 to EDA system 105.

If, however, the determined propagation delay does not meet the timing constraint in block 450, optimizer 120 will attempt to adjust the length of one or more trunks in block 460. In one embodiment, calculator 130 calculates a time differential between the determined propagation delay and the timing constraint. Trace manipulator 115 will attempt to adjust the length of one or more sections of trunk to change the propagation delay by the amount of the time differential. The length of the adjustment is estimated by calculator 130 using a propagation delay coefficient. The propagation delay coefficient, however, may be different for different layers of the PCB. For instance, traces in different layers may have different cross sections or different conductivity resulting in different delay coefficients. Therefore, trace manipulator 115 must first identify one or more trunks or sections of trunk to adjust, so that the propagation delay coefficients for the respective layer or layers can be used by calculator 130 to estimate the length of the adjustment.

Trace manipulator 115 identifies the one or more trunks or sections of trunk to adjust based on a selection criteria. In one embodiment, the selection criteria starts by examining straight sections of trunk in decreasing order of length. That is, the adjustment will start with the longest available section of trunk, and move down to shorter sections as needed.

When increasing the length, a section is available if it has at least a minimum amount of surrounding available space. That is, a "trombone," which is basically just a deviation from the most direct path, will first be added to the longest section of trunk that has at least a minimum amount of surrounding available space. As discussed with reference to FIGS. 5A, B, and C below, space for a parallel trombone is preferred over space for a perpendicular trombone. This is because a trombone that extends parallel to a trunk is less likely to interfere with neighboring traces than a trombone that extends perpendicular to a trunk. Several sections may need to be lengthened on several different layers of the PCB, so the estimated length may be calculated based on a number of propagation delay coefficients. Once all the available space around the longest section is occupied, the next longest section is used, and so on, until the estimated propagation delay is within the timing constraint.

When decreasing the length, a section is available if it deviates from the most direct path possible. In one embodiment, the longest section with a shorter possible path will be shortened first. For instance, as discussed with reference to FIGS. 5A, B, and C below, a trombone can be deleted from a section, or a corner between two sections can be mitered, in order to shorten the path. Where a section has two trombones, a perpendicular trombone is deleted before a parallel trombone, and a longer trombone is deleted before a shorter trombone. Several sections may need to be shortened on multiple layers of a PCB, so the estimated length may be calculated based on a number of propagation delay coefficients. Once the longest section is reduced to the most direct path possible, the next longest section is reduced using the propagation delay coefficient for that layer, and so on, until the estimated propagation delay is within the timing constraint.

If the determined propagation delay is longer than the maximum allowable propagation delay for the differential pair, but trace manipulator 115 cannot identify a section or sections of trunk to be shortened, then the timing constraint cannot be met. Similarly, if the determined propagation delay is shorter than the minimum allowable propagation delay of the timing constraint, but trace manipulator 115 cannot identify a section or sections having available surrounding space, then the timing constraint cannot be met. In either case, in block 470, trace manipulator 115 will recognize that the timing constraint cannot be met, and in block 490, trace manipulator 115 will flag the fault in the database. If no additional differential pairs remain to be optimized, optimizer 120 will transfer the database back to EDA system 105 with the flagged fault. If additional differential pairs remain to be optimized, trace manipulator 115 will begin the process of FIG. 4 again with block 410.

If, however, the estimated length can be added to or deleted from one or more sections of trunk, as appropriate, then calculator 130 calculates a length that is estimated to be equivalent to the time differential based on the respective propagation delay coefficients for the one or more sections of trunk, as discussed above. Calculator 130 then provides the estimated length or lengths to trace manipulator 115. Trace manipulator 115 then routes the adjustments as selected by the selection criteria.

In block 470, where the adjustment has been made, the process loops back to block 430. The propagation delay must be redetermined over the adjusted path because the adjustment is merely an estimation based on the propagation delay coefficients for the respective layers of PCB. As discussed above, the actual propagation delay also depends on neighboring components and conductors. The process continues to loop until the timing constraint is met or the timing constraint cannot be met. The entire process of FIG. 4 is repeated until no differential pairs remain to be optimized in the database.

Figure 5A:
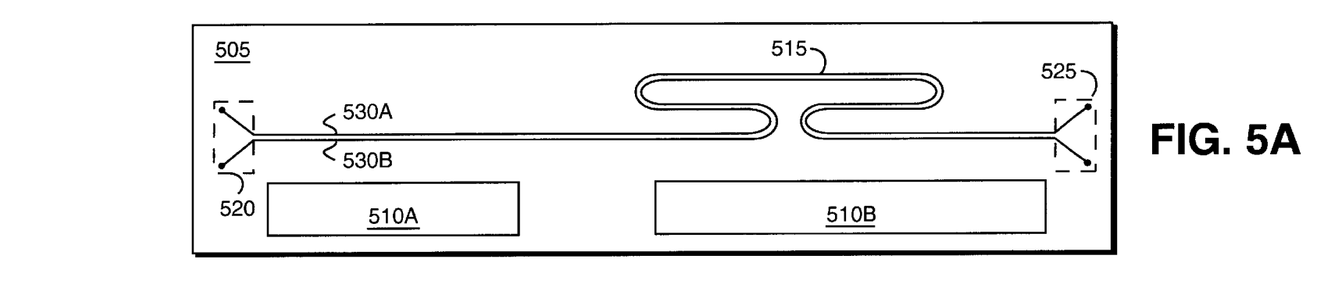
FIGS. 5A, B, and C illustrate one example of a differential pair as it is optimized.
Figure 5B:
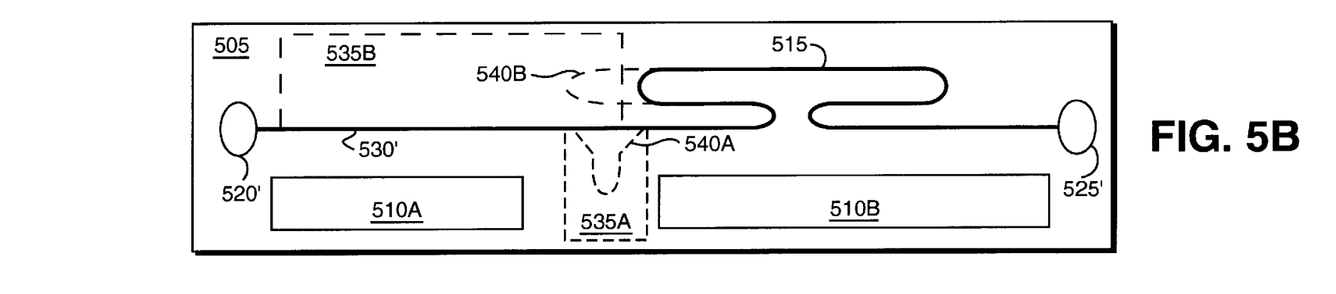
Figure 5C:
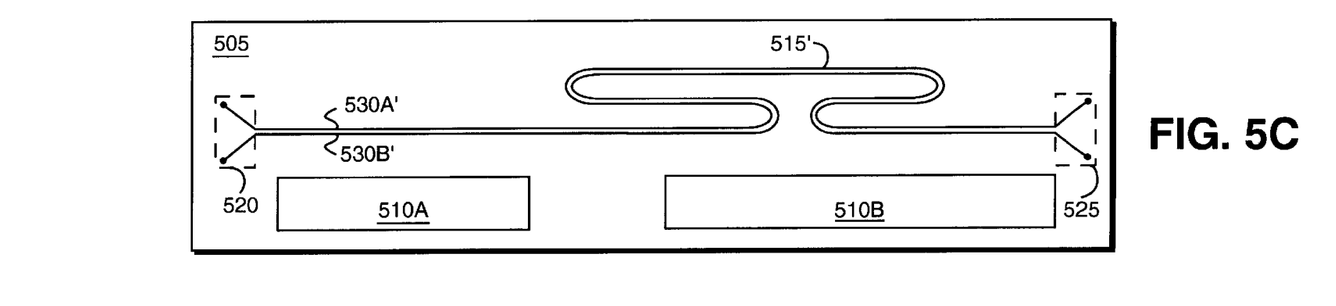

FIG. 5A illustrates one embodiment of a physical circuit layout on PCB 505, wherein traces 530A and 530B comprise a differential pair. Obstacles 510A and 510B represent any component or feature which prevents traces from being routed in the respective areas. When the differential pair was routed by EDA system 105, EDA system 105 included a trombone 515 in the differential pair. Trombone 515 was added intentionally by EDA 105 to give optimizer 120 a margin of delay with which to work.

Since a differential pair remains to be optimized in the circuit, EDA system 105 provides a database representing the circuit to optimizer 120. The database defines the physical layout of the circuit, as well as timing constraints, timing characteristics, and differential pair employment rules for the circuit. As discussed above, optimizer 120 analyzes the database and recognizes that traces 530A and 530B comprise a differential pair, based on the employment rules. Traces 530A and 530B are parallel over the entire length between endpoint regions 520 and 525. Therefore, optimizer 120 will combine the parallel section of traces 530A and 530B between endpoint regions 520 and 525 into a trunk 530' as shown in FIG. 5B.

Trunk 530' is a single fat trace which occupies the physical space of traces 530A and 530B, and has the same timing characteristics as the traces. Endpoint regions 520 and 525 are treated like large connectors 520' and 525' which occupy the physical space of the endpoint regions, and introduce delay equivalent to that of the endpoint regions.

Optimizer 120 determines the propagation delay over the differential pair using the fast mode or slow mode, as selected by EDA system 105, by accumulating the delay introduced by trunk 530' and connectors 520' and 525'. For example, the delay introduced by trunk 530' could be 4 microseconds, and the delay introduced by connectors 520' and 525' could be 1 microsecond each, for an accumulated determined propagation delay of 6 microseconds. Optimizer 120 then compares the determined propagation delay to the timing constraint for the differential pair. For instance, the timing constraint may define a maximum propagation delay of 9 microseconds and a minimum propagation delay of 6.5 microseconds.

If the timing constraint were met, optimizer 120 would return the database to EDA system 105 unchanged. In the illustrated example, however, the timing constraint is not met. So, optimizer 120 calculates a time differential between the determined propagation delay and the timing constraint. Here, the propagation delay is 0.5 microseconds outside of the timing constraint. In certain embodiments, optimizer 120 calculates the time differential with respect to the middle of the timing constraint, in which case the time differential is 1.75 microseconds.

Then, optimizer 120 analyzes trunk 530' for a place to add a length. As shown in FIG. 5B, the differential pair includes only one trunk 530'. Trunk 530' has one straight section between endpoint regions 520' and 525', wherein the straight section includes one trombone 515. Optimizer 120 identifies two available areas 535A and 535B of surrounding space. In order for a space to be available, it must include a minimum spacing requirement.

A minimum spacing requirement is the minimum amount of space required on either side of a trunk. For instance, when a trunk doubles back on itself to form a trombone, at least a minimum amount of space must separate the doubled back portion from the rest of the trunk. The minimum spacing requirement is technology dependent. For instance, traces may be required to align with a grid pattern on the PCB. Generally, a trombone with 90 degree bends requires less space than a trombone with 45 degree bends. For high frequency circuits, though, 45 degree bends are preferred. Therefore, in certain embodiments, optimizer 120 will attempt to use 45 degree bends before resorting to 90 degree bends. Here, however, both available areas 535A and 535B are large enough to allow for 45 degree bends.

Optimizer 120 also prefers parallel trombones over perpendicular trombones. This is because, in a more complex circuit, additional differential pairs and traces may be running parallel to trunk 530'. A perpendicular trombone, such as 540A, is more likely to interfere with adjustments made to other traces than a parallel trombone, such as 515. Therefore, optimizer 120 will select area 535B before resorting to area 535A.

After a section of trunk is selected, optimizer 120 estimates a length to add to trunk 530' based on the propagation delay coefficient for trunk 530' in PCB 505. The propagation delay coefficient is provided by EDA system 105 in the database. Here, a length is calculated which is estimated to introduce 1.75 microseconds of delay.

In certain embodiments, optimizer 120 will extend trombone 515 into area 535B before adding a second trombone. Extension 540B is estimated to introduce 1.75 microseconds of delay. If all of area 535B had been exhausted and not enough delay had been added, optimizer 120 would have resorted to area 535A, and added perpendicular trombone 540A.

Optimizer 120 then redetermines the propagation delay and compare it to the timing constraint. Since the added length in an estimation based only on the propagation delay coefficient for trunk 530' in the PCB, a number of iterations may be required to met the timing constraint. In the illustrated example however, the timing constrain is met on the first iteration, so optimizer 120 separates trunk 530' into adjusted differential pair 530A' and 530B' with extended trombone 515' as shown in FIG. 5C. Assuming no additional differential pairs remain to be optimized, optimizer 120 sends the adjusted database back to EDA system 105.

If the determined propagation delay had been longer than the maximum allowable delay, all or part of trombone 515 could have been deleted to reduce the length of trunk 530', and therefore reduce the propagation delay. If, however, trombone 515 had been completely deleted and the delay was still too long, the timing constraint could not be met because the shortest possible path for trunk 530' would still be too long. In that case, the differential pair would have been flagged as faulty.

Conversely, if the initially determined propagation delay was excessively too short and extending trunk 530' to fully occupy both areas 535A and 535B did not introduce enough delay, then the timing constraint could not be met. Again, the differential pair would be flagged as faulty.

In alternate embodiments, a differential pair can be routed in two adjacent layers, rather than one layer. Those skilled in the art will recognize that the teachings of the present invention can likewise be applied to differential pairs in adjacent layers. For instance, the traces could be combined into a trunk on a single layer, wherein obstacles on both layers are also combined onto the single layer.

A differential pair may also be optimized at the chip level, for instance, in a system-on-a-chip design. Those skilled in the art will recognize that the teachings of the present invention can likewise be applied to a differential pair routed within a single chip.

Figure 6:
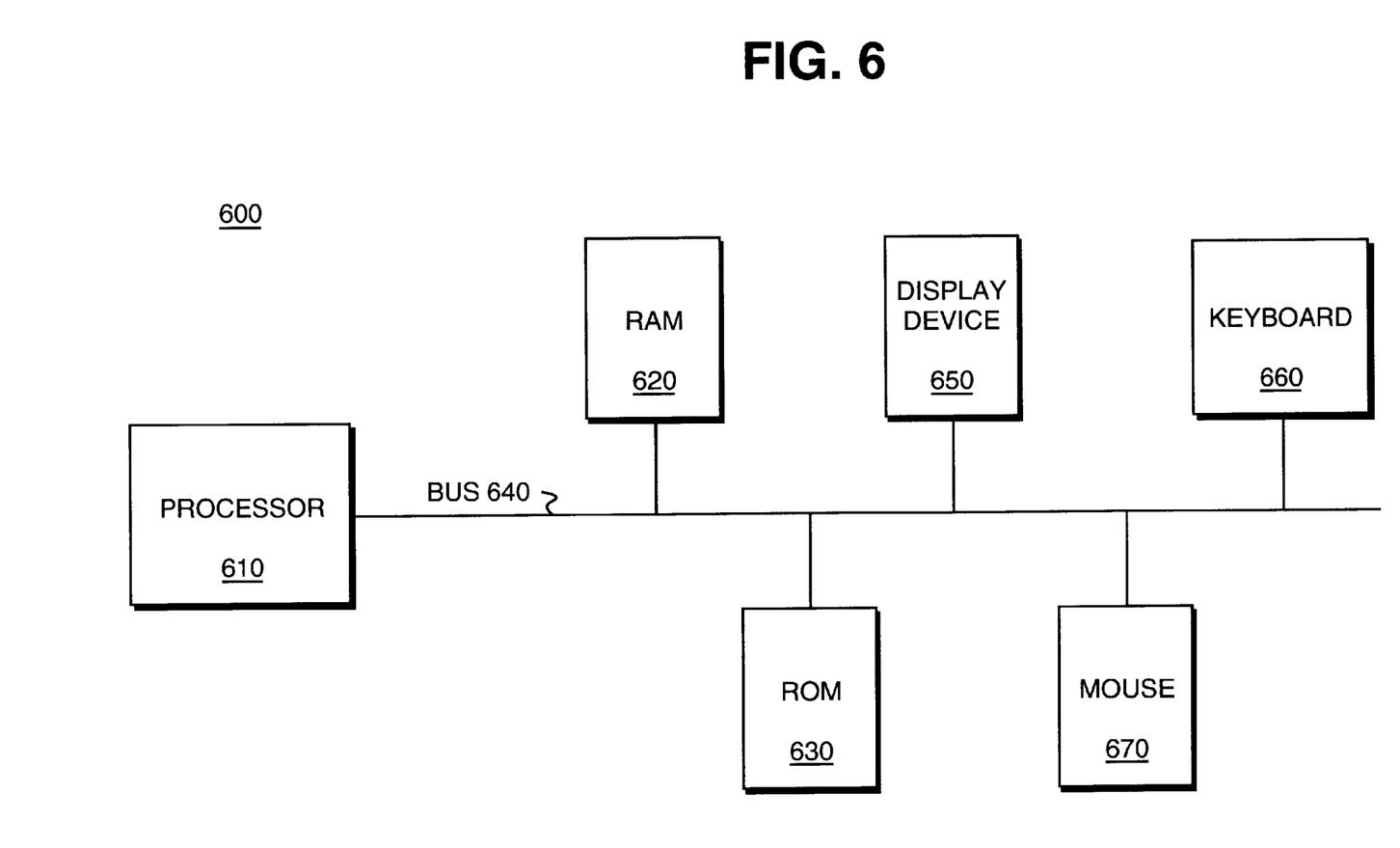
FIG. 6 is a block diagram of a computer system in which one embodiment of the present invention may be employed.

FIG. 6 is intended to represent a broad category of computer systems including, but not limited to, those based on the Pentium® processor, Pentium® Pro processor, and Pentium® II processor manufactured by and commonly available from Intel Corporation of Santa Clara, Calif., or the Alpha® processor manufactured by Digital Equipment Corporation of Maynard, Mass. In FIG. 6, processor 610 includes one or more microprocessors. Processor 610 is coupled to random access memory (RAM) 620 and read only memory (ROM) 630 by bus 640. Input/Output devices, including display device 650, keyboard 660, and mouse 670, are also coupled to bus 640. In certain embodiments, one or more components may be eliminated, combined, or rearranged. A number of additional components may also be coupled to bus 640 including, but not limited to, a bus bridge to another bus, one or more disk drives, an internet interface, additional audio/video interfaces, additional memory units, and additional processor units.

Optimizer 120 and EDA system 105, as shown in FIG. 1, can be executed by processor 610 as a series or sequence of instructions or function calls stored, for instance, in ROM 630 or RAM 620. Alternately, the instructions could be stored on a distribution medium, such as a CD ROM, a digital video or versatile disk (DVD), or a magnetic storage medium like a floppy disk or tape. The instructions could also be downloaded from a local or remote server.

Alternately, one or more ASICs (application specific integrated circuits) could be endowed with some or all of the functionality of optimizer 120 and EDA system 105, and inserted into system 600 as separate components, or combined with one or more other components.

Thus, an improved method and apparatus for automatically optimizing a differential pair based on timing constraints is described. Whereas many alterations and modifications of the present invention will be comprehended by a person skilled in the art after having read the foregoing description, it is to be understood that the particular embodiments shown and described by way of illustration are in no way intended to be considered limiting. Therefore, references to details of particular embodiments are not intended to limit the scope of the claims.

What is claimed is:

1. A method comprising:

recognizing a differential pair;

combining the differential pair into one or more trunks;

determining a propagation delay over the differential pair;

comparing the determined propagation delay to a timing constraint;

adjusting a length of the one or more trunks, if the timing constraint is not met;

repeating the determining, comparing, and adjusting, if the timing constraint is not met, until the timing constraint is met or until the timing constraint cannot be met; and producing an adjusted differential pair from the one or more trunks, if the timing constraint is met.

2. The method of claim 1, wherein the recognizing comprises:

receiving a database representing a physical circuit layout, said database specifying differential pair employment rules; and analyzing the database to recognize a pair of individual traces substantially complying with the differential pair employment rules.

3. The method of claim 1, wherein the combining comprises:

recognizing sections of the differential pair between endpoint regions and via regions; and converting said sections into the one or more trunks, wherein a particular trunk is a single line representation of a particular section of the differential pair.

4. The method of claim 1, wherein the determining comprises one of:

formulating the determined propagation delay in a fast mode based on an accumulated capacitance for the differential pair; and simulating operation of a physical circuit layout containing the differential pair in a slow mode and measuring the determined propagation delay in the simulation.

5. The method of claim 1, wherein the comparing comprises:

ascertaining if the determined propagation delay falls within a maximum and minimum propagation delay defined by the timing constraint.

6. The method of claim 1, wherein the adjusting comprises:

identifying a time differential between the determined propagation delay and the timing constraint;

identifying one or more particular trunks from the one or more trunks;

estimating a length of the one or more particular trunks that is equivalent to the time differential based on a propagation delay factor; and changing one or more particular lengths of the one or more particular trunks by a total amount equal to the estimated length.

7. The method of claim 6, wherein the identifying one or more particular trunks comprises:

employing a selection criteria wherein, if the determined propagation delay is less than the timing constraint, straight sections of the one or more trunks are examined, in order of decreasing length, for surrounding available space, wherein said available space must satisfy a minimum spacing requirement factor, and wherein parallel available space is preferred over perpendicular available space, and if the determined propagation delay is more than the timing constraint, the one or more trunks are examined, in order of decreasing length, for deviations from a most direct path, wherein perpendicular deviations are preferred over parallel deviations.

8. The method of claim 6, wherein the changing comprises:

adding one or more trombone lengths to the one or more particular trunks if the determined propagation delay is less than the timing constraint; and removing one or more trombone lengths from the one or more particular trunks if the determined propagation delay is more than the timing constraint.

9. The method of claim 1, wherein the producing comprises:

dividing the one or more trunks into separate individual traces of the adjusted differential pair.

10. The method of claim 1, wherein traces of the differential pair propagate in one of a single layer and separate adjacent layers of one of a printed circuit board and a chip.

11. A machine-readable storage medium having stored therein a plurality of programming instructions, designed to be executed by a processor, wherein execution of the plurality of programming instructions implements the method of:

recognizing a differential pair;

combining the differential pair into one or more trunks;

determining a propagation delay over the differential pair;

comparing the determined propagation delay to a timing constraint;

adjusting a length of the one or more trunks, if the timing constraint is not met;

repeating the determining, comparing, and adjusting, if the timing constraint is not met, until the timing constraint is met or until the timing constraint cannot be met; and producing an adjusted differential pair from the one or more trunks, if the timing constraint is met.

12. The machine readable storage medium of claim 11, wherein the recognizing comprises:

receiving a database representing a physical circuit layout, said database specifying differential pair employment rules; and analyzing the database to recognize a pair of individual traces substantially complying with the differential pair employment rules.

13. The machine readable storage medium of claim 11, wherein the combining comprises:

recognizing sections of the differential pair between endpoint regions and via regions; and converting said sections into the one or more trunks, wherein a particular trunk is a single line representation of a particular section of the differential pair.

14. The machine readable storage medium of claim 11, wherein the determining comprises one of:

formulating the determined propagation delay in a fast mode based on an accumulated capacitance for the differential pair; and simulating operation of a physical circuit layout containing the differential pair in a slow mode and measuring the determined propagation delay in the simulation.

15. The machine readable storage medium of claim 11, wherein the comparing comprises:

ascertaining if the determined propagation delay falls within a maximum and minimum propagation delay defined by the timing constraint.

16. The machine readable storage medium of claim 11, wherein the adjusting comprises:
- identifying a time differential between the determined propagation delay and the timing constraint;
- identifying one or more particular trunks from the one or more trunks;
- estimating a length of the one or more particular trunks that is equivalent to the time differential based on a propagation delay factor; and
- changing one or more particular lengths of the one or more particular trunks by a total amount equal to the estimated length.

17. The machine readable storage medium of claim 16, wherein the identifying one or more particular trunks comprises:
- employing a selection criteria wherein, if the determined propagation delay is less than the timing constraint, straight sections of the one or more trunks are examined, in order of decreasing length, for surrounding available space, wherein said available space must satisfy a minimum spacing requirement factor, and wherein parallel available space is preferred over perpendicular available space, and if the determined propagation delay is more than the timing constraint, the one or more trunks are examined, in order of decreasing length, for deviations from a most direct path, wherein perpendicular deviations are preferred over parallel deviations.

18. The machine readable storage medium of claim 16, wherein the changing comprises:
- adding one or more trombone lengths to the one or more particular trunks if the determined propagation delay is less than the timing constraint; and
- removing one or more trombone lengths from the one or more particular trunks if the determined propagation delay is more than the timing constraint.

19. The machine readable storage medium of claim 11, wherein the producing comprises:
- dividing the one or more trunks into separate individual traces of the adjusted differential pair.

20. The machine readable storage medium of claim 11, wherein traces of the differential pair propagate in one of a single layer and separate adjacent layers of one of a printed circuit board and a chip.

21. An apparatus comprising:
- an optimizer, said optimizer to
  - recognize a differential pair,
  - combine the differential pair into one or more trunks,
  - determine a propagation delay over the differential pair,
  - compare the determined propagation delay to a timing constraint,
  - adjust a length of the one or more trunks, if the timing constraint is not met,
  - repeat the determined, comparing, and adjusting, if the timing constraint is not met, until the timing constraint is met or until the timing constraint cannot be met, and
  - produce an adjusted differential pair from the one or more trunks, if the timing constraint is met.

22. The apparatus of claim 21, wherein the optimizer to recognize the differential pair is to:
- receive a database representing a physical circuit layout, said database specifying differential pair employment rules; and
- analyze the database to recognize a pair of individual traces substantially complying with the differential pair employment rules.

23. The apparatus of claim 21, wherein the optimizer to combine the differential pair into one or more trunks is to:
- recognize sections of the differential pair between endpoint regions and via regions; and
- convert said sections into the one or more trunks, wherein a particular trunk is a single line representation of a particular section of the differential pair.

24. The apparatus of claim 21, wherein the optimizer to determine the propagation delay is to one of:
- formulate the determined propagation delay in a fast mode based on an accumulated capacitance for the differential pair; and
- simulate operation of a physical circuit layout containing the differential pair in a slow mode and measure the determined propagation delay in the simulation.

25. The apparatus of claim 21, wherein the optimizer to compare the determined propagation delay to the timing constraint is to:
- ascertain if the determined propagation delay falls within a maximum and minimum propagation delay defined by the timing constraint.

26. The apparatus of claim 21, wherein the optimizer to adjust the length of the one or more trunks is to:
- identify a time differential between the determined propagation delay and the timing constraint;
- identify one or more particular trunks from the one or more trunks;
- estimate a length of the one or more particular trunks that is equivalent to the time differential based on a propagation delay factor; and
- change one or more particular lengths of the one or more particular trunks by a total amount equal to the estimated length.

27. The apparatus of claim 26, wherein the optimizer to identify the one or more particular trunks is to:
- employ a selection criteria wherein, if the determined propagation delay is less than the timing constraint, straight sections of the one or more trunks are examined, in order of decreasing length, for surrounding available space, wherein said available space must satisfy a minimum spacing requirement factor, and wherein parallel available space is preferred over perpendicular available space, and if the determined propagation delay is more than the timing constraint, the one or more trunks are examined, in order of decreasing length, for deviations from a most direct path, wherein perpendicular deviations are preferred over parallel deviations.

28. The apparatus of claim 26, wherein the optimizer to change the one or more particular lengths is to:
- add one or more trombone lengths to the one or more particular trunks if the determined propagation delay is less than the timing constraint; and
- remove one or more trombone lengths from the one or more particular trunks if the determined propagation delay is more than the timing constraint.

29. The apparatus of claim 21, wherein the optimizer to produce the adjusted differential pair is to:
- divide the one or more trunks into separate individual traces of the adjusted differential pair.

30. The apparatus of claim 21, wherein traces of the differential pair propagate in one of a single layer and separate adjacent layers of one of a printed circuit board and a chip.

* * * * *